United States Patent [19]
Suematsu

[11] Patent Number: 5,914,899
[45] Date of Patent: Jun. 22, 1999

[54] SEMICONDUCTOR MEMORY HAVING A PAGE MODE IN WHICH PREVIOUS DATA IN AN OUTPUT CIRCUIT IS RESET BEFORE NEW DATA IS SUPPLIED

[75] Inventor: Yasuhiro Suematsu, Yokohama, Japan

[73] Assignee: Kabushiki Kaisha Toshiba, Tokyo, Japan

[21] Appl. No.: 08/947,124

[22] Filed: Oct. 8, 1997

Related U.S. Application Data

[63] Continuation-in-part of application No. 08/675,446, Jul. 3, 1996, abandoned.

[30] Foreign Application Priority Data

Jul. 5, 1995 [JP] Japan ................................. 7-169699

[51] Int. Cl.$^6$ ................................................. G11C 7/00
[52] U.S. Cl. ................................. 365/189.05; 365/233
[58] Field of Search ........................... 365/189.05, 233

[56] References Cited

U.S. PATENT DOCUMENTS

| | | | |
|---|---|---|---|
| 5,289,413 | 2/1994 | Tsuchida et al. | 365/230.02 |
| 5,497,351 | 3/1996 | Oowaki | 365/230.04 |
| 5,517,462 | 5/1996 | Iwamoto et al. | 365/233 |
| 5,521,878 | 5/1996 | Ohtani et al. | 365/233 |
| 5,559,452 | 9/1996 | Saito | 365/189.05 |

FOREIGN PATENT DOCUMENTS

| | | |
|---|---|---|
| 427286 | 5/1991 | European Pat. Off. . |
| 477380 | 4/1992 | European Pat. Off. . |

OTHER PUBLICATIONS

"Hyper page mode DRAM," Electronic Engineering, vol. 66, No. 813, Sep. 1994, pp. 47–48.

*Primary Examiner*—David Nelms
*Assistant Examiner*—M. Tran
*Attorney, Agent, or Firm*—Loeb & Loeb LLP

[57] ABSTRACT

A semiconductor memory device resets a latch data output before new data is transferred in a successive data output mode, in order to improve a high-speed access operation of the semiconductor memory. Data stored in a memory cell of a memory cell array or a register portion arranged in a column direction are successively accessed with a signal /CAS as a trigger. The accessed data is output through an output buffer in a clock cycle between a trigger of the signal /CAS and a next trigger thereof. In the output buffer of the semiconductor memory, immediately before an output cycle of new data transmitted from the memory cell through a data line, the previous data is reset and a data output portion is set to a high-impedance state by the signal /CAS. Thereafter, the new data is supplied to the output buffer through the data line.

26 Claims, 4 Drawing Sheets

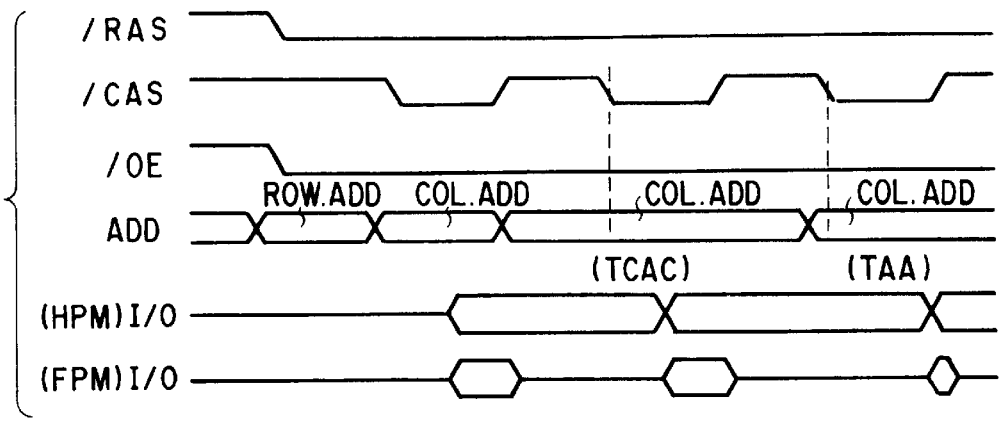
F I G. 1
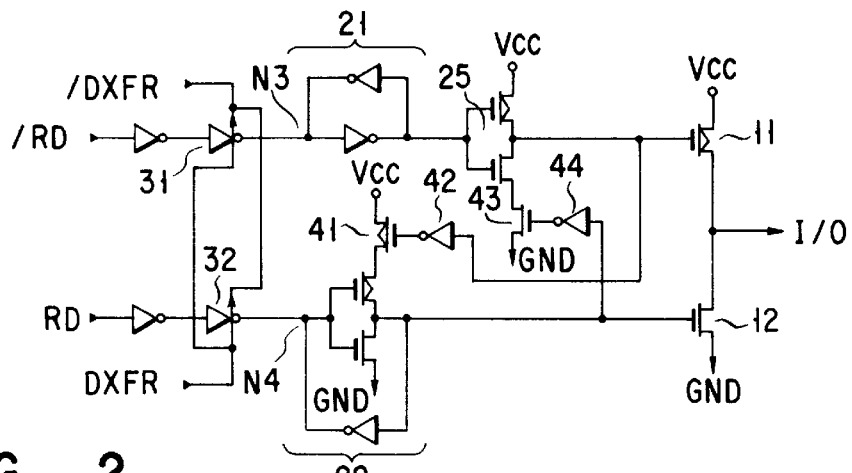
F I G. 2
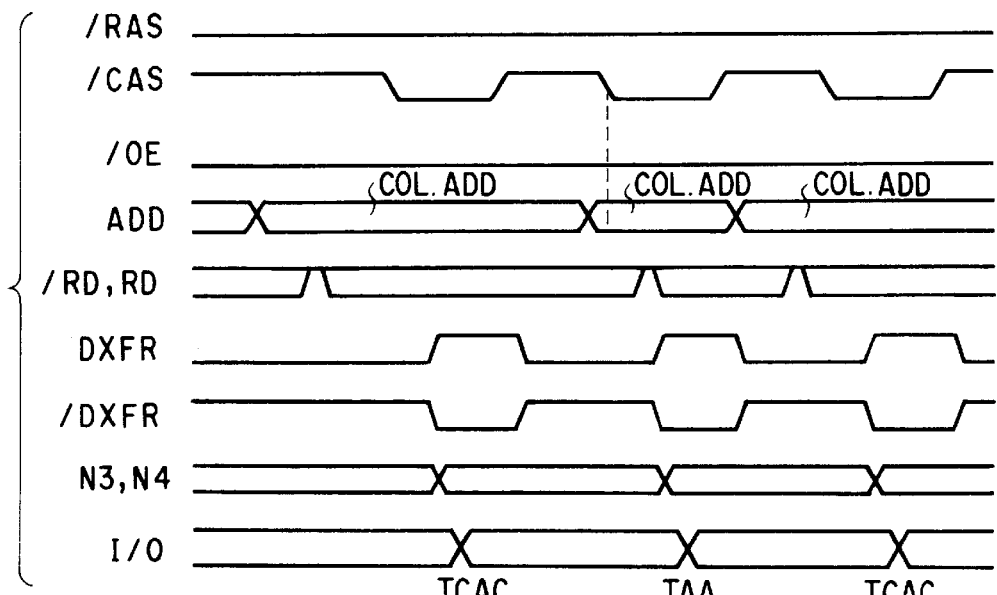
F I G. 3

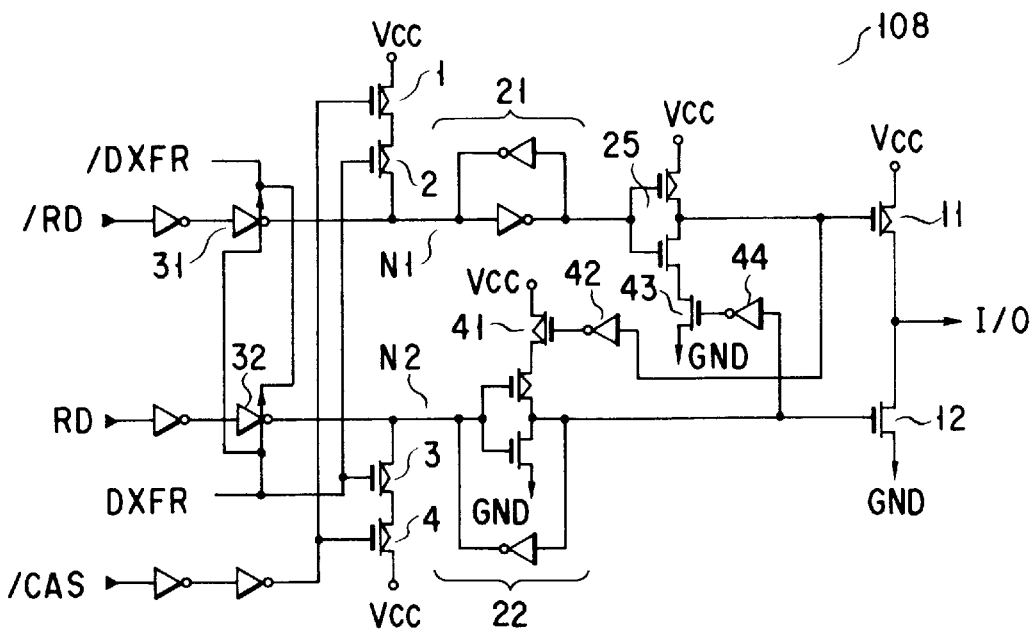
F I G. 5
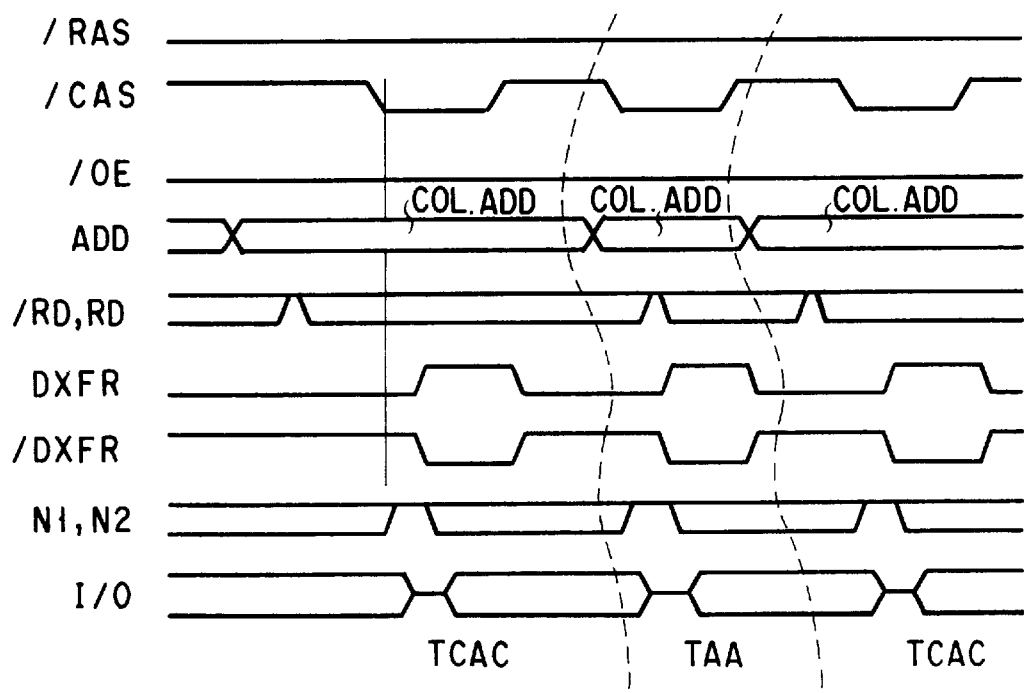
F I G. 6

SEMICONDUCTOR MEMORY HAVING A PAGE MODE IN WHICH PREVIOUS DATA IN AN OUTPUT CIRCUIT IS RESET BEFORE NEW DATA IS SUPPLIED

This is a continuation of application Ser. No. 08/675,446, filed Jul. 3, 1996, now abandoned

BACKGROUND OF THE INVENTION

1. Field of the Invention

The present invention relates to a semiconductor memory which is required to be operated at a high speed, and more particularly to an output buffer structure of the memory.

2. Description of the Related Art

A hyper page mode (hereinafter referred to as HPM) is one the of high speed operation modes of a DRAM. In this mode, when data stored in an internal memory cell or a register is consecutively accessed in accordance with an address signal defined by means of a predetermined clock signal (/CAS: a fall signal of CAS) as a trigger, the accessed data is output, as it is, in a clock cycle between the triggers of a clock signal and the next clock signal. The mode is also called an extended data output mode (EDO).

FIG. 1 is a waveform diagram in which data output states in the HPM and the conventional page mode in a DRAM are compared. In this specification, the page mode is called a fast page mode and abbreviated as (FPM). An address signal ADD is divided into a row address (ROW.ADR) and a column address (COL.ADR). The row address is defined by a row selecting signal /RAS (a fall signal of RAS) and the column address is defined by a column selecting signal /CAS (a fall signal of CAS). The column address is consecutively changed, and data in a memory cell (not shown) accessed with the addresses is indicated as an output I/O.

In FIG. 1, the waveform determined by an access time (TCAC) from the signal /CAS and the waveform determined by an access time (TAA) from an address signal are indicated on the same time axis. In the TCAC, data in the corresponding address has already been accessed at the trailing edge of the signal /CAS. On the other hand, in the TAA, since even after the signal /CAS has fallen, data in the corresponding address is accessed, data is defined at a lower speed as compared to the TCAC. Hence, the data definition is slower TAA than in TCAC by this access time, and previous data is continuously output during the access time in the HPM.

As shown in FIG. 1, a data output in the FPM cannot be maintained, when the signal /CAS becomes "H" level. On the other hand, in the HPM, even when the signal /CAS becomes "H" level, a data output is maintained, until memory data of the next address is accessed due to the next fall of the signal /CAS. As the operation frequency of a memory becomes higher and higher, a specification, which is difficult in the FPM, is available in the HPM.

FIG. 2 is a circuit diagram of a conventional output buffer which achieves data output in the HPM of a DRAM. Complementary signals RD and /RD input to an output buffer are data read from a memory cell. Complementary signals DXFR and /DXFR control clocked inverters 31 and 32, thereby controlling transference of the signals RD and /RD to the output buffer.

Data outputs from the clocked inverters 31 and 32 are respectively supplied to latch circuits 21 and 22. Each of the latch circuits is constituted by two inverters, the output of one inverter and the input of the other being connected to each other. An output of the latch circuit 21 is connected to the gate of a P-channel MOS transistor 11 via an inverter 25. An output of the latch circuit 22 is connected to the gate of an N-channel MOS transistor 12. The MOS transistors 11 and 12 are data outputting transistor circuits, and a common drain output of these transistors is connected to a data output I/O.

One of the inverters constituting the latch circuit 22 has a P-channel MOS transistor 41 for controlling a current path to a power source Vcc. An output of the inverter 25 is supplied to the gate of the transistor 41 through an inverter 42. The inverter 25 has an N-channel MOS transistor 43 for controlling a current path to a ground potential GND. An output from the latch circuit 22 is supplied to the gate of the transistor 43 through an inverter 44. These elements serve as a circuit for preventing a through current of the data output transistor circuits.

Gate control of the transistors 11 and 12 is achieved by supplying "HI" (high) or "L" (low) level signals to the gates of the transistors. Therefore, current consumption is efficiently reduced by a through current preventing operation in which a Vcc output from the inverter 25 first turns off the P-channel MOS transistor 11 and then turns on the transistor 42 and a Vcc output from the latch circuit 22 turns on the N-channel MOS transistor 12, or a through current preventing operation in which a GND output from the latch circuit 22 first turns off the N-channel MOS transistor 12 and then turns on the transistor 43 and a GND output from the inverter 25 turns on the P-channel MOS transistor 11. The above structure for preventing the through current is particularly significant in a multi-bit product.

FIG. 3 is a waveform diagram illustrating operations of the circuit shown in FIG. 2. Subsequently to the signal /RAS, an address signal in the memory is defined by the fall of the signal /CAS. Data in the memory corresponding to the address signal is transmitted as signals RD and /RD, which are determined after equalizing the "H" level in a data line. The signals DXFR and /DXFR are caused to be "H" level and "L" level respectively, so that new data of the signals RD and /RD are transferred to the output buffer shown in FIG. 2. The new data are output, while latch data previously output in the /CAS cycle is being reset.

The circuit configuration shown in FIG. 2 has the following drawback. In the latch circuits 21 and 22, new data cannot be output, until the output data in the previous cycle has been completely reset by the new data. Hence, the access time is increased, particularly when output data is full swing. In addition, since the through current preventing circuit is provided, the operations of the MOS transistors 11 and 12 at the final stage of the buffer are delayed due to feedback of a signal.

As described above, according to the conventional art, the output buffer having a function of consecutively outputting data in synchronism with a clock signal resets latch data in the previous cycle with newly transferred data. Therefore, it takes a considerable period of time to output desired new data, resulting in prevention of a high-speed access to a semiconductor memory.

SUMMARY OF THE INVENTION

The present invention has been made in consideration of the above drawback of the conventional art. It is accordingly an object of the present invention to provide a semiconductor memory having an output buffer, which easily reduces access time.

The object can be achieved by the following structure: a semiconductor memory device comprising:
a memory cell array in which a plurality of memory cells for storing data are arranged;
transmitting means for transmitting a signal corresponding to data in a memory cell of the memory cell array, which is accessed by an address signal defined in synchronism with a clock signal; and
an output buffer circuit including a data output transistor circuit in which an output corresponding to the data is maintained in a clock cycle determined by the clock signal, the data output transistor circuit, which maintains a first output in a first clock cycle of the clock cycle, being first set to a high-impedance state with a trigger of the clock signal to start a second clock cycle subsequent to the first clock cycle, and then the output buffer fetching new data from the data line when the second clock cycle starts, so that a second output can be obtained.

With the above structure, immediately before an output cycle of new data transmitted from the memory cell through a data line, the previous data is reset by the clock signal. Therefore, high-speed output is achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a waveform diagram in which data output states in the HPM and the conventional page mode in a DRAM are compared;

FIG. 2 is a circuit diagram of a conventional output buffer which outputs data in the HPM in a DRAM;

FIG. 3 is a waveform diagram illustrating operations of the circuit shown in FIG. 2;

FIG. 5 is a circuit diagram showing the structure of an output buffer according to a second embodiment of the present invention;

FIG. 6 is a waveform diagram illustrating operations of the circuit shown in FIG. 5;

DETAILED DESCRIPTION OF THE PREFERRED EMBODIMENTS

Figure 4:
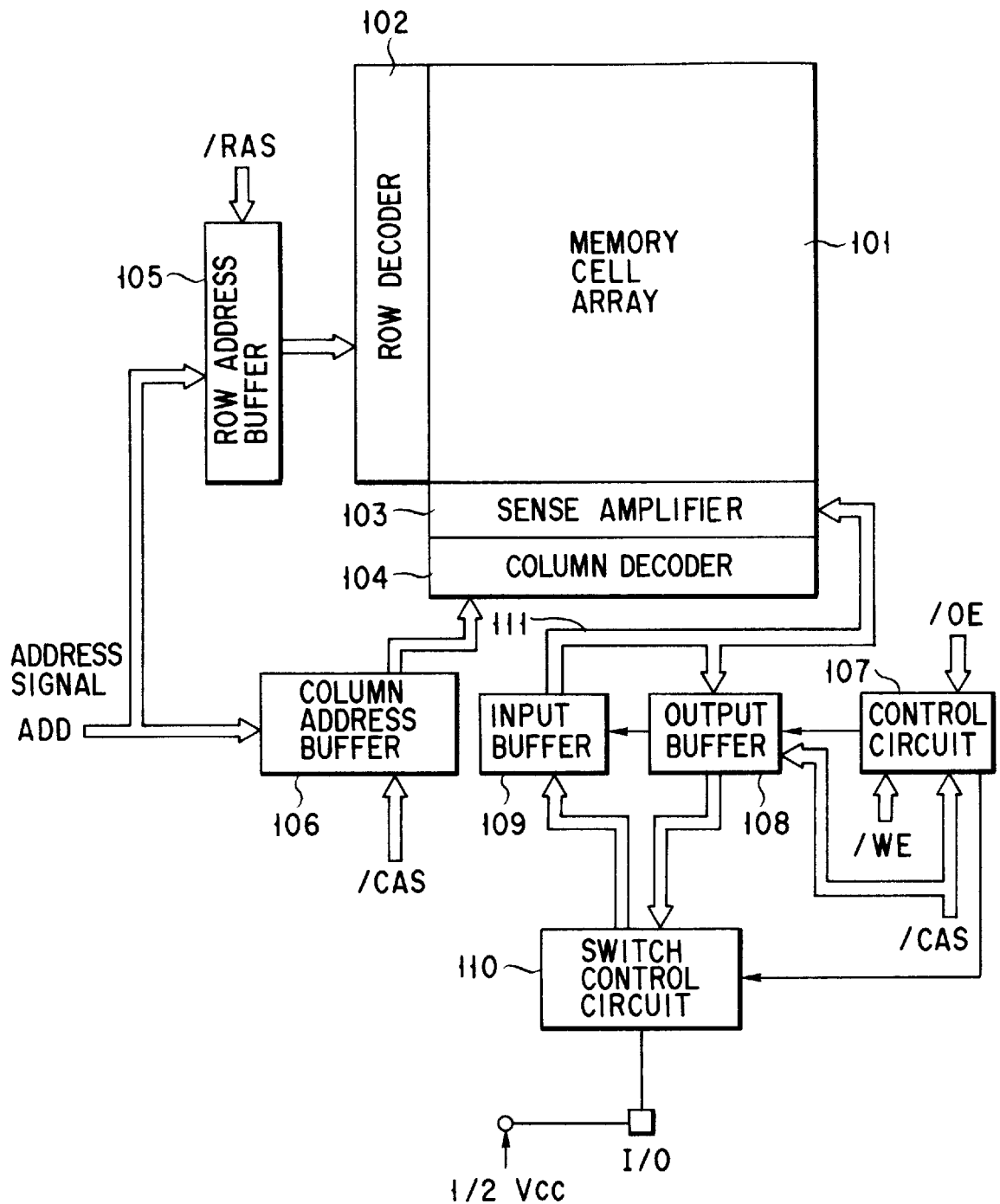
FIG. 4 is a block diagram showing main part of a DRAM according to a first embodiment of the present invention.

FIG. 4 is a block diagram showing the main part of a DRAM according to a first embodiment of the present invention.

A memory cell array 101 comprises a plurality of memory cells for storing data. A row decoder 102, a sense amplifier 103 and a column decoder 104 constitute a memory core section used to read or write data in or from the memory cell or to refresh data in response to an address signal. The address signal is output from a row address buffer 105 and a column address buffer 106, to which /RAS (a fall signal of RAS) and /CAS (a fall signal of CAS) are respectively input. A control circuit 107 receives /WE (a fall signal of WE) of a write enable signal, /OE (a fall signal of OE) of an output enable signal, the signal /CAS and so on, and controls an output buffer 108, an input buffer 109 and a switch control circuit 110 which electrically switches these buffers so as to be connected to an output I/O. The output I/O can be clamped in a power source 1/2 Vcc via, for example, an external circuit, during a floating time when the output potential is unstable.

The above structure is characterized in a reading operation for realizing data output in the HPM. More specifically, data stored in a memory cell in the memory cell array 101 or a register provided in the column direction (e.g., a sense amplifier) is consecutively accessed using an external clock signal, e.g., the signal /CAS, as a trigger. The accessed data is output as it is through the output buffer 108 in a clock cycle between the trigger of the signal /CAS and the next trigger. The semiconductor memory thus constructed, in which the signal /CAS is supplied to the output buffer 108, contributes to data output control.

In the output buffer 108, data is reset by the signal /CAS, just before an output cycle of new data output through a data line 111 from a memory cell. Since immediately thereafter, new data is supplied through the data line 111 to the output buffer, a high-speed output operation is realized.

The structure of the output buffer 108 will be described in detail.

FIG. 5 is a circuit diagram showing the structure of an output buffer according to a second embodiment of the present invention. The circuit of FIG. 5 is different from that of FIG. 2 in that a signal /CAS of an external clock signal is introduced and an output of a logical circuit, like a NAND gate, of signals /CAS and DXFR (a data transfer control signal) is supplied to nodes N1 and N2. More specifically, current paths of P-channel MOS transistors 1 and 2 are formed in series between a power source Vcc and the node N1 of the transmission lines of the clocked inverter 31 and the latch circuit 21. Current paths of P-channel MOS transistors 3 and 4 are formed in series between the power source Vcc and the node N2 of the transmission lines of the clocked inverter 32 and the latch circuit 22. The signal /CAS is supplied to the gates of the transistors 1 and 4, and the signal DXFR is supplied to the gates of the transistors 2 and 3. The other elements are the same as those of the circuit shown in FIG. 2, and identified by the same reference numerals as those in FIG. 2. The clocked inverters 31 and 32 for transferring and controlling signals RD and /RD of data read from a memory cell are activated when the signal DXFR becomes "H" level and the signal /DXFR becomes "L" level. Signal data of /RD and RD are respectively supplied to the latch circuits 21 and 22. Each of the latch circuits 21 and 22 is constituted by two inverters, the output of one inverter and the input of the other being connected to each other. An output of the latch circuit 21 is connected to the gate of a P-channel MOS transistor 11 via an inverter 25. An output of the latch circuit 22 is connected to the gate of an N-channel MOS transistor 12. The MOS transistors 11 and 12 are data outputting transistor circuits, and a common drain output of these transistors is connected to a data output I/O. One of the inverters constituting the latch circuit 22 has a P-channel MOS transistor 41 for controlling a current path to a power source Vcc. An output of the inverter 25 is supplied to the gate of the transistor 41 through an inverter 42. The inverter 25 has an N-channel MOS transistor 43 for controlling a current path to a ground potential GND. An output from the latch circuit 22 is supplied to the gate of the transistor 43 through an inverter 44. These elements serve as a circuit for preventing a through current of the data output transistor circuits (11, 12), as described before with reference to FIG. 2.

FIG. 6 is a waveform diagram illustrating operations of the circuit shown in FIG. 5. Subsequently to the signal /RAS, an address signal in the memory is defined by the fall of /CAS. Data in the memory corresponding to the address signal is transmitted as signals RD and /RD, which are determined after equalizing the "H" level in a data line. Immediately after the fall of the signal /CAS, the signals DXFR and /DXFR respectively become "L" level and "H" level (the levels of signals immediately before the clock cycle which is to start upon fall of the signal /CAS), and the clocked inverters 31 and 32 are in an non-operating state. In this state, P-channel transistors 1 to 4 are turned on by the "L" level of the signal /CAS and the "L" level of the signal DXFR. As a result, both the nodes N1 and N2 become "H" level, thereby resetting latch data in the latch circuits 21 and 22. At the same time, "H" and "L" level signals are respectively applied to the gates of the P-channel and N-channel MOS transistors 11 and 12 (the data output transistor circuits), thereby turning off the transistors 11 and 12. Consequently, the output of the data output transistor circuit becomes a high-impedance state (1/2 Vcc). Thereafter, the signals DXFR and /DXFR respectively become "H" and "L" levels, so that the clocked inverters 31 and 32 are operated, thereby transferring new data RD and /RD to the nodes N2 and N1. In this time, since the signal DXFR is "H" level, the transistors 2 and 3 are off. Since it is only necessary that the new data RD and /RD turn either the latch circuit 21 or 22 to "L" level, the data setting speed in the latch circuits 21 and 22 is increased.

In FIG. 6, as in FIG. 3, the waveform determined by an access time (TCAC) from /CAS and the waveform determined by an access time (TAA) from an address signal are indicated on the same time axis. The portion of TAA is roughly marked off by broken lines. With the above structure, first data is maintained by the latch circuits 21 and 22 in a first reading cycle in a /CAS cycle, and the data output transistor circuits (the MOS transistors 11 and 12), which output data in accordance with the first data, is set in a high-impedance state utilizing a trigger of a leading signal /CAS to start a second reading cycle after the first reading cycle. At the same time, the latch circuits 21 and 22 are reset. Then, the second reading cycle starts upon change in the signals DXFR and /DXFR. As a result, second data (signals RD and /RD) are latched by the latch circuits 21 and 22, and new data corresponding to the second data are output from the data output transistor circuit.

Since the latch circuits 21 and 22 have been reset with a trigger of the signal /CAS before new data are transferred and the data output transistor circuits (11, 12) are set to a high-impedance state, it is unnecessary to wait for the data output transistor (11 or 12) to be turned off. Hence, the access time from the fall of the signal /CAS can be reduced. Consequently, even if the operation frequency of the memory is increased as compared to that in the conventional HPM, a high-speed access operation can easily be performed.

Figure 7:
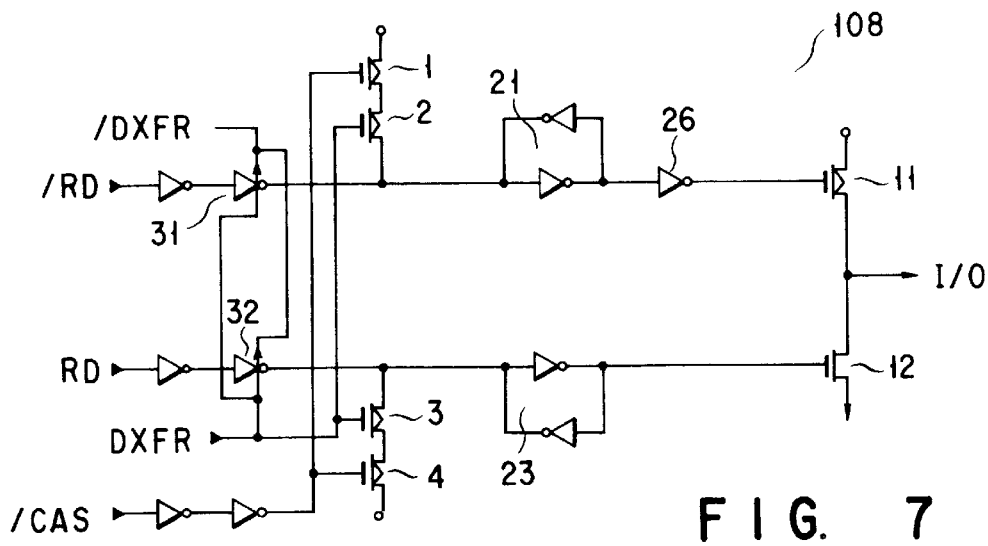
FIG. 7 is a circuit diagram showing the structure of an output buffer according to a third embodiment of the present invention.

FIG. 7 is a circuit diagram showing the structure of an output buffer according to a third embodiment of the present invention. The structure is different from that of FIG. 5 in that the circuit for preventing a through current is not provided. Since the latch circuits 21 and 22 have been reset with a trigger of the signal /CAS before new data are transferred and the data output transistor circuits (11, 12) are set to a high-impedance state, no circuit for preventing a through current is required. Thus, the critical path for data transfer can be shortened to a minimum, thereby achieving an access operation at a higher speed. However, when the operation frequency of the memory is increased as high as possible so long as the memory is accessible, it requires less time to set the data output transistors (11, 12). In this case only, the circuit as shown in FIG. 5 is more stable than that as shown in FIG. 7.

Figure 8:
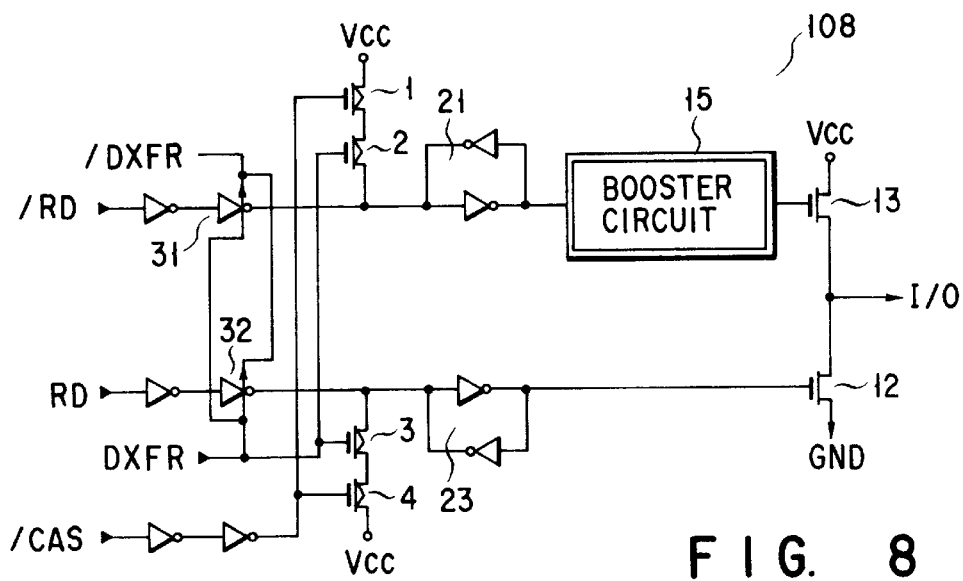
FIG. 8 is a circuit diagram showing the structure of an output buffer according to a fourth embodiment of the present invention.

FIG. 8 is a circuit diagram showing the structure of an output buffer according to a fourth embodiment of the present invention. The structure is different from that of FIG. 5 in data output transistor circuits (13, 12). The data output transistor circuits (11, 12) shown in FIG. 7 are CMOS transistor circuits, whereas the data output transistor circuits shown in FIG. 8 are both N-channel transistor circuits. More specifically, the P-channel MOS transistor 11 in FIG. 7 is replaced with an N-channel MOS transistor 13, which can be driven at a higher speed than a P-channel MOS transistor. As a result, the inverter 26 shown in FIG. 7 is not required logically. Instead, voltage drop in an amount of threshold voltage must be taken into consideration, that is, an ON voltage, which is increased at least in an amount of the threshold voltage of the transistor 13, is required to turn on the N-channel MOS transistor 13. For this purpose, a booster circuit 15 is provided to boost the gate voltage of the transistor 13 in a data pull-up output time in the transistor circuits (13, 12). The above structure, like the structure as shown in FIG. 7, allows the critical path for data transfer to be shortened to a minimum, and the data output transistor to be driven at a higher speed, thus contributing to a high-speed access operation of the memory.

Figure 9:
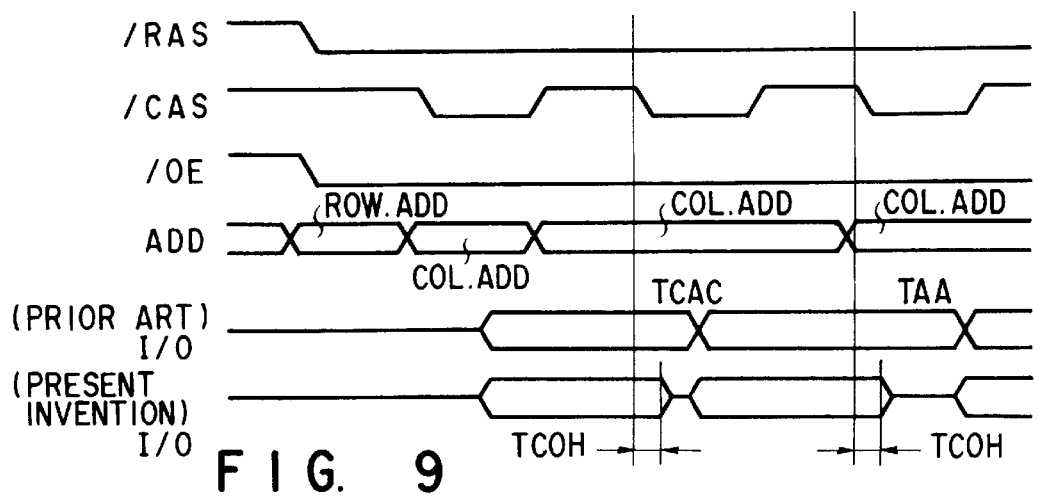
FIG. 9 is a waveform diagram illustrating evaluation of the output state in the HPM according to the present invention.

FIG. 9 is a waveform diagram illustrating evaluation of the output state in the HPM according to the present invention, in which the output state of the present invention is compared with that of the circuit shown in FIG. 2. In FIG. 9, TCOH denotes a command hold time, which evaluates the length of a period of maintaining data from the "H" edge before the "L" level, i.e., the end of the /CAS cycle. According to the present invention, before new data is supplied, the latch circuits in the output buffer circuit are reset utilizing a trigger of the signal /CAS for the new data and the output of the data output transistor circuits becomes a high impedance state (1/2 Vcc). Thus, since the data output transistor does not output any data when the signal /CAS falls to "L" level, the data output maintaining period is reduced as compared to that of the conventional art. However, since the length of TCOH is maintained so as not to influence both TCAC and TAA, the reduction of the data output maintaining period causes no problem. In addition, since an output of the data output transistor circuit is clamped in 1/2 Vcc (high impedance state) before outputting new data, the time required to start data output is reduced as compared to the conventional art.

Although the above description is limited to the operation state in the HPM of the DRAM, the present invention is not limited thereto. For example, the clock signal need not be /CAS but can be any clock signal generated in the memory. The present invention is applicable to a semiconductor memory which can be successively accessed by using a clock signal as a trigger and which can output the accessed data as it is in a cycle between the trigger of a clock signal and the trigger of a next clock signal.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
    a memory cell array in which a plurality of memory cells for storing data are arranged;
    a transmitting circuit that transmits a signal corresponding to data in a memory cell of the memory cell array, which is accessed by an address signal defined in synchronism with a clock signal; and
    an output buffer circuit that receives the signal from the transmitting circuit and outputs the data that corresponds to the signal,
    wherein the output buffer circuit includes:
        a transfer circuit controlled by a transfer control signal, that selectively transfers the signal from the transmitting circuit to a signal line;
        a latch circuit that stores the signal on the signal line;
        an output circuit coupled to the latch circuit, the output circuit outputting the data corresponding to the signal stored in the latch circuit; and
        a reset circuit that selectively resets the latch circuit so that a predetermined signal is stored,
        the reset circuit for supplying a potential to the signal line, the reset circuit having first and second MOS transistors connected in series, whose gates receive the transfer control signal and the clock signal, and
        wherein the output of the output circuit is set to a high-impedance state when the latch circuit is reset.

2. The semiconductor memory device as defined in claim 1, wherein the output of the output circuit is clamped at an intermediate level of an output logical level when the output circuit is in the high-impedance state.

3. A semiconductor memory device comprising:
    a memory cell array in which a plurality of memory cells for storing data are arranged;
    a transmitting circuit that transmits a signal corresponding to data in a memory cell of the memory cell array, which is accessed by an address signal defined in synchronism with an external clock signal; and
    an output buffer circuit that receives the signal from the transmitting circuit and outputs the data that corresponds to the signal,
    wherein the output buffer circuit includes:
        a transfer circuit controlled by a transfer control signal, that selectively transfers the signal from the transmitting circuit to a signal line;
        a latch circuit that stores the signal on the signal line;
        an output circuit coupled to the latch circuit, the output circuit outputting the data corresponding to the signal stored in the latch circuit; and
        a reset circuit that selectively resets the latch circuit so that a predetermined signal is stored,
        the reset circuit for supplying a potential to the signal line, the reset circuit having first and second MOS transistors connected in series, whose gates receive the transfer control signal and the external clock signal,
    and wherein the output of the output circuit is set to a high-impedance state when the latch circuit is reset.

4. The semiconductor memory device as defined in claim 3, wherein the transfer circuit is activated when the transfer control signal changes to an active level after the external clock signal falls to a first value, and the reset circuit resets the latch circuit based on a logical operation performed between the first value of the external clock signal and the transfer control signal that is at a non-active level immediately before the transfer control signal changes to the active level.

5. The semiconductor memory device as defined in claim 4, wherein the reset circuit is connected to the signal fine arranged between the transfer circuit and the latch circuit, and the first and second MOS transistors are P-channel MOS transistors.

6. The semiconductor memory device as defined in claim 4, wherein the external clock signal is a column address strobe signal, wherein each time the reset circuit receives the column address strobe signal, the output of the output buffer circuit is first set to a high-impedance state for an arbitrary period using the column address strobe signal as a trigger and then the output buffer circuit outputs the data stored in the memory cell at a row and column designated by the row address and column address.

7. The semiconductor memory device as defined in claims 4, wherein the output circuit is a CMOS transistor circuit.

8. The semiconductor memory device as defined in claim 7, wherein the latch circuit includes two inverters with an output of a first inverter connected to an input of a second inverter, and wherein an output of the latch circuit is connected to a gate of a P-channel MOS transistor of the CMOS transistor circuit via a third inverter.

9. The semiconductor memory device as defined in claim 7, wherein the latch circuit includes two inverters with an output of a first inverter connected to an input of a second inverter, and an output of the latch circuit is connected to a gate of an N-channel MOS transistor of the CMOS transistor circuit.

10. The semiconductor memory device as defined in claim 7, wherein the output buffer circuit includes a circuit for preventing a through current of the output circuit.

11. The semiconductor memory device as defined in claim 3, wherein the output circuit is an N-channel MOS transistor circuit.

12. The semiconductor memory device as defined in claim 11, wherein the latch circuit includes a first latch and a second latch, the first latch comprising two inverters with an output of a first inverter connected to an input of a second inverter, an output of the first latch connected to a gate of an N-channel MOS transistor on a pull-up side of the output circuit, and an output of the second latch connected to a gate of an N-channel MOS transistor on a pull-down side of the output circuit.

13. The semiconductor memory device as defined in claim 12, wherein the output buffer circuit includes a booster circuit for boosting a gate voltage of the N-channel MOS transistor on the pull-up side of the output circuit during a data pull-up operation of the output circuit.

14. The semiconductor memory device as defined in claim 3, wherein the output of the output circuit is clamped at an intermediate level of an output logical level when the output circuit is in the high-impedance state.

15. A semiconductor memory device comprising:
    a memory cell array in which a plurality of memory cells for storing data are arranged;

a transmitting circuit that transmits a signal corresponding to data in a memory cell of the memory cell array, which is accessed by an address signal defined in synchronism with an external clock signal; and an output buffer circuit including a latch circuit coupled to a data output transistor circuit, the output buffer circuit receiving the signal from the transmitting circuit and outputting the corresponding data, the output buffer including a reset circuit that selectively resets the latch circuit so that a predetermined signal is stored in the latch circuit, the reset circuit for supplying a potential to the signal line, the reset circuit having first and second MOS transistors connected in series, the gates of the first and second MOS transistors connected to receive the transfer control signal and the external clock signal, wherein after a first external clock signal is received, the latch circuit stores first data to cause the data output transistor circuit to output the first data, and after a second external clock signal is received, the latch circuit is first reset by using the second external clock signal as a trigger to cause the output of the data output transistor circuit to go to a high-impedance state, and then the latch circuit fetches and stores second data from the transmitting circuit to cause the second data to be output from the data output transistor circuit.

16. The semiconductor memory device as defined in claim 15, wherein each time the output of the data output transistor circuit is changed from one accessed data to a next accessed data, the reset circuit sets the output of the data output transistor circuit to the high-impedance state for an arbitrary period before outputting the next accessed data.

17. The semiconductor memory device as defined in claim 15, wherein each time the output buffer circuit outputs data, the reset circuit sets the output of the data output transistor circuit to the high-impedance state for an arbitrary period before outputting the data.

18. The semiconductor memory device as defined in claim 15, wherein the output buffer circuit includes logical output means that utilizes a signal level of the external clock signal as a trigger to reset stored data corresponding to a previous data that has been output and to set the output of the data output transistor circuit to the high-impedance state.

19. A semiconductor memory device comprising:

a memory cell array that includes memory cells arranged in rows and columns for storing data;

a read circuit that reads data stored in one of the memory cells; and an output buffer circuit for outputting the data read by the read circuits, wherein the read circuit accesses one of the rows of memory cells in accordance with a row address defined in synchronism with a row address strobe signal, and successively accesses the memory cells in selected columns of the accessed row of memory cells in accordance with successive column addresses defined in synchronism with successive column address strobe signals, and each time a column address strobe signal is received, the output of the output buffer circuit is first set to a high-impedance state for an arbitrary period using the column address strobe signal as a trigger, and then the output buffer circuit outputs the data stored in the memory at the row and column designated by the row address and column address.

20. The semiconductor memory device as defined in claim 19, wherein the output buffer circuit includes first and second latch circuits for storing signals output by the read circuit, the signals corresponding to the data read from the accessed memory cell, and each time a column address strobe signal is received, the first and second latch circuits are first reset so as to store predetermined signals, and then the first and second latch circuits receive and store signals corresponding to the data stored in the memory at the column and row designated by the row address and column address.

21. The semiconductor memory device as defined in claim 20, wherein the output buffer circuit includes a P-channel MOS transistor and an N-channel MOS transistor connected in series between a power source voltage and a reference voltage, the output of the output buffer circuit being taken from a series connection point between the P-channel MOS transistor and the N-channel MOS transistor, and an output of the first latch circuit is coupled to the gate of the P-channel MOS transistor and an output of the second latch circuit is coupled to the gate of the N-channel MOS transistor.

22. The semiconductor memory device as defined in claim 20, wherein the output buffer circuit includes two N-channel MOS transistors connected in series between a power source voltage and a reference voltage, the output of the output buffer circuit being taken from a series connection point between the two N-channel MOS transistors, and an output of the first latch circuit is coupled to the gate of one of the N-channel MOS transistors and an output of the second latch circuit is coupled to the gate of the other of the N-channel MOS transistors.

23. A semiconductor memory device comprising:

a memory cell array that includes memory cells arranged in rows and columns for storing data;

a read circuit that reads data stored in one of the memory cells and transmits a signal corresponding to the read data; and an output buffer circuit that receives the signal from the read circuit and outputs the data corresponding to the signal, wherein the output buffer circuit includes:

a transfer circuit controlled by a transfer control signal, that selectively transfers the signal from the read circuit to a signal line;

a latch circuit that stores the signal on the signal line, an output circuit coupled to the latch circuit, the output circuit outputting the data corresponding to the signal stored in the latch circuit; and a reset circuit that selectively resets the latch circuit so that a predetermined signal is stored, the reset circuit for supplying a potential to the signal line, the reset circuit having first and second MOS transistors connected in series, whose gates receive the transfer control signal and an external clock signal, and wherein the output of the output circuit is set to a high-impedance state when said latch circuit is reset.

24. The semiconductor memory device as defined in claim 23, wherein each time data is to be output from the output buffer circuit, the reset circuit first resets the latch circuit, and then the transfer circuit transfers the signal, which corresponds to the data to be output, from the read circuit to the signal line to be stored by the latch circuit so that the corresponding data is output from the output circuit.

25. The semiconductor memory device as defined in claim 24, wherein when the reset circuit resets the latch circuit, the output of the output circuit goes into a high-impedance state and remains in the high impedance state until after the transfer circuit transfers the signal from the read circuit to the signal line.

26. The semiconductor memory device as defined in claim 24, wherein the reset circuit is activated by an external clock signal and is deactivated by an internal control signal.

* * * * *